US008659911B2

(12) United States Patent
Muro

(10) Patent No.: US 8,659,911 B2
(45) Date of Patent: Feb. 25, 2014

(54) FIXING METAL BRACKET FOR COMPONENT MOUNTED ON CIRCUIT BOARD

(75) Inventor: Takashi Muro, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/811,830

(22) PCT Filed: Jul. 21, 2011

(86) PCT No.: PCT/JP2011/066591
§ 371 (c)(1),
(2), (4) Date: Jan. 23, 2013

(87) PCT Pub. No.: WO2012/014782
PCT Pub. Date: Feb. 2, 2012

(65) Prior Publication Data
US 2013/0118789 A1    May 16, 2013

(30) Foreign Application Priority Data
Jul. 27, 2010  (JP) .................................. 2010-167814

(51) Int. Cl.
*H05K 7/02* (2006.01)
*H05K 7/04* (2006.01)

(52) U.S. Cl.
USPC ........... 361/807; 361/759; 361/748; 361/810; 361/825

(58) Field of Classification Search
USPC ............ 361/748, 759, 807, 810, 825; 439/74, 439/563–570; 248/201, 300, 309.1
See application file for complete search history.

(56) References Cited

U.S. PATENT DOCUMENTS

| 6,012,949 A * | 1/2000 | Lok ................................ 439/570 |
| 7,048,576 B2 * | 5/2006 | Nakano .......................... 439/570 |
| 7,128,581 B2 * | 10/2006 | Igarashi et al. ................... 439/74 |
| 2005/0124228 A1 | 6/2005 | Nakano et al. |
| 2008/0290236 A1 * | 11/2008 | Sakamoto et al. .......... 248/309.1 |

FOREIGN PATENT DOCUMENTS

| JP | 9171857 A | 6/1997 |
| JP | 2005166491 A | 6/2005 |
| JP | 2009266499 A | 11/2009 |
| JP | 2010116603 A | 5/2010 |

OTHER PUBLICATIONS

International Search Report (PCT/ISA/210) dated Sep. 13, 2011 issued by the International Searching Authority in counterpart International Application No. PCT/JP2011/066591.
Written Opinion (PCT/ISA/237) dated Sep. 13, 2011 issued by the International Searching Authority in counterpart International Application No. PCT/JP2011/066591.

* cited by examiner

*Primary Examiner* — Tuan T Dinh
(74) *Attorney, Agent, or Firm* — Sughrue Mion, PLLC

(57) ABSTRACT

A fixing metal bracket for a component mounted on a circuit board, includes a solder bonding plate section to be solder-fixed on a surface of a circuit board with a cream solder, and a component fixing section to be fixed to a component mounted on the circuit board. An annular through-groove is formed on the solder bonding plate section at a position surrounding a central area thereof. An island-shaped portion at the inside of the through-groove is separated from a peripheral portion at the outside of the through-groove while the connection part is remained. A step is formed on a solder bonding face of the connection part. Pure Sn plating is applied to the solder bonding face of the island-shaped portion and whisker resistance plating is applied to a surface of a portion other than the island-shaped portion.

1 Claim, 3 Drawing Sheets

(a)

(b)

(a)

(b)

(a)

(b)

FIXING METAL BRACKET FOR COMPONENT MOUNTED ON CIRCUIT BOARD

TECHNICAL FIELD

The present invention relates to a fixing metal bracket which is adapted to fix a component such as a board mount connector or the like on a circuit board by soldering.

BACKGROUND ART

For example, a fixing metal bracket which is adapted to fix a board mount connector on a circuit board by soldering is configured such that a surface thereof is generally applied with Sn (tin) plating in order to improve a soldering property. However, in a case where a fixing metal bracket applied with Sn plating is attached to a circuit board by soldering, an internal stress or an external stress is applied to a solder bonding portion so that a capillary crystal referred to as a whisker may be created. It is pointed out that a short circuit may possibly occur between the fixing metal bracket and a component around it by being caused by the whisker.

It is known that occurrence of a whisker is related to an internal stress or an external stress applied to an Sn plating layer as described above. Patent Document 1 discloses a technique in which a recessed portion having a depth which is 0.4 to 1.0 times of a thickness of the Sn plating layer is formed, and an internal stress or an external stress applied to the Sn plating layer is absorbed by the recessed portion, thereby suppressing occurrence of the whisker.

PRIOR ART DOCUMENTS

Patent Documents

Patent Document 1: JP-A-2009-266499

SUMMARY OF INVENTION

Problems that the Invention is to Solve

However, in order to form the recessed portion having the depth which is 0.4 to 1.0 times of the thickness of the Sn plating layer as the technique described in Patent Document 1, it requires a particularly high processing precision. Therefore, the manufacturing is not easy with respect to a member such as a fixing metal bracket which is enough by a rough precision.

The purpose of the invention is to solve the above problem and to provide a fixing metal bracket for a component mounted on a circuit board, which can be readily manufactured without requiring a particularly high processing precision, and can exhibit a good soldering property and a high whisker resistance property.

Means for Solving the Problems

The above purpose of the invention can be achieved by the following configurations.

(1) A fixing metal bracket for a component amounted on a circuit board includes a solder bonding plate section configured to be solder-fixed on a surface of a circuit board by a cream solder, and a component fixing section configured to be fixed to a component to be mounted on the circuit board.

In the fixing metal bracket, an annular through-groove which is formed on the solder bonding plate section at a position surrounding a central area thereof so as to pass therethrough in a plate thickness direction while a connection part is partially remained in a circumferential direction so that an island-shaped portion at the inside of the through-groove is separated from a peripheral portion at the outside of the through-groove while the connection part is remained. A step recessed from a solder bonding face of the island-shaped portion is formed on a solder bonding face of the connection part, pure Sn plating is applied to the solder bonding face of the island-shaped portion, and thereby whisker resistance plating is applied to a surface other than the solder bonding face.

In accordance with the fixing metal bracket having the configuration described in the above item (1), since the pure Sn plating is applied to the solder bonding face of the island-shaped portion at the inside of the annular through-groove, it is possible to cause the island-shaped portion to exhibit a good soldering property (a solder adhesion property). In addition, since the whisker resistance plating is applied to the peripheral portion at the outside of the island-shaped portion, it is possible to cause the peripheral portion to exhibit a good whisker resistance property while the soldering property is not so good.

Therefore, while a whisker is created on the island-shaped portion to which the pure Sn plating is applied, there is not any chance that growth of the whisker spreads to the peripheral portion so that it is possible to prevent a component at the outside of the fixing metal bracket from being influenced by the whisker.

In addition, since there is the step on the solder bonding face of the connection part which is partially left at the annular through-groove in the circumferential direction thereof, it is possible to prevent spreading of heterogeneity plating by the step and to suppress growing of the whisker, and thereby it is also possible to eliminate any chance that a peripheral portion is influenced by the whisker via the connection part.

Consequently, a short circuit with a peripheral component caused by a whisker can be prevented in advance. In addition, the fixing metal bracket has a simple configuration in which the through-groove is formed on the solder bonding plate section, the step is provided on the connection part and kinds of plating are differentiated by each area. Therefore, the manufacturing is easy and increase of the cost can be suppressed. As the above whisker resistance plating, for example, Sn—Cu plating or Sn—Ag plating can be listed.

BRIEF DESCRIPTION OF THE DRAWINGS

FIG. 1 is a structural view showing a fixing metal bracket according to an embodiment of the invention, wherein FIG. 1(a) is a perspective view showing the same obliquely viewed from the upper side and FIG. 1(b) is a perspective view showing the same obliquely viewed from the lower side.

FIG. 2 is a schematic view showing a state in which a board mount connector is fixed on a circuit board by using the fixing metal bracket according to the embodiment of the invention, wherein FIG. 2(a) is an entire perspective view showing the state and FIG. 2(b) is an enlarged perspective view showing a main part of the state.

FIG. 3 is a schematic view showing a portion where a whisker is created in a case where the embodiment of the invention is used, wherein FIG. 3(a) is an entire view showing the portion and FIG. 3(b) is an enlarged view of a part B shown in FIG. 3(a).

MODE FOR CARRYING OUT THE INVENTION

Figure 1:
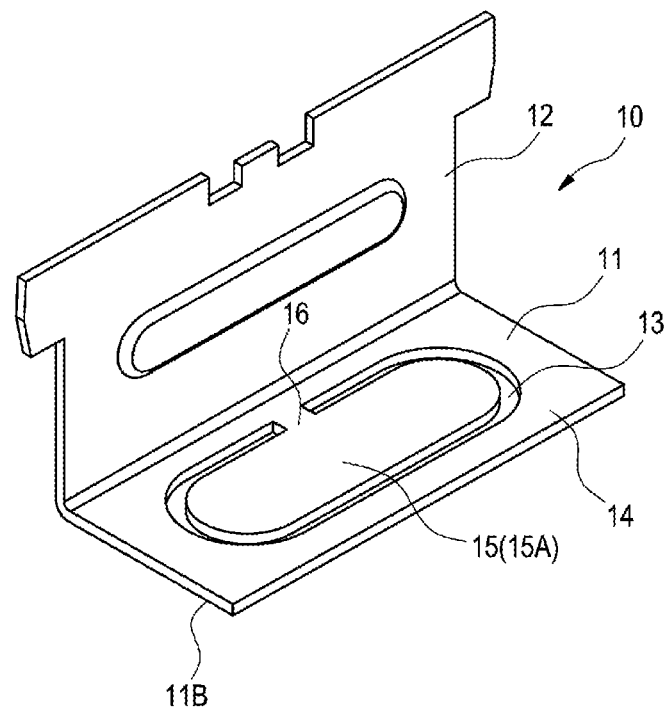
Figure 1:
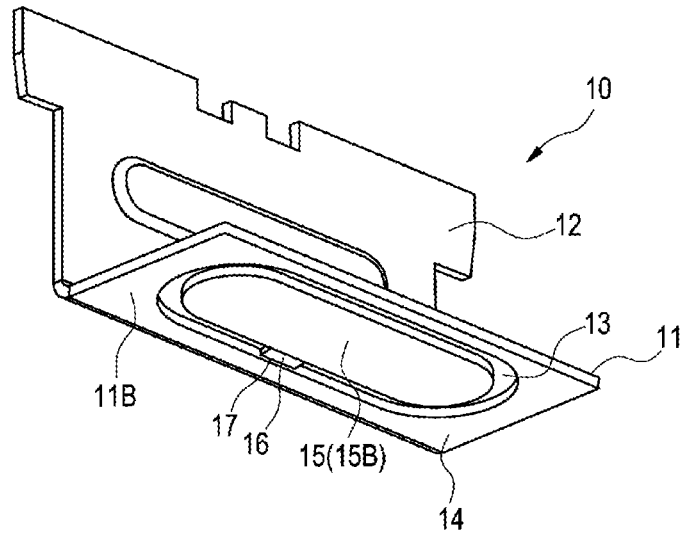
Figure 2:
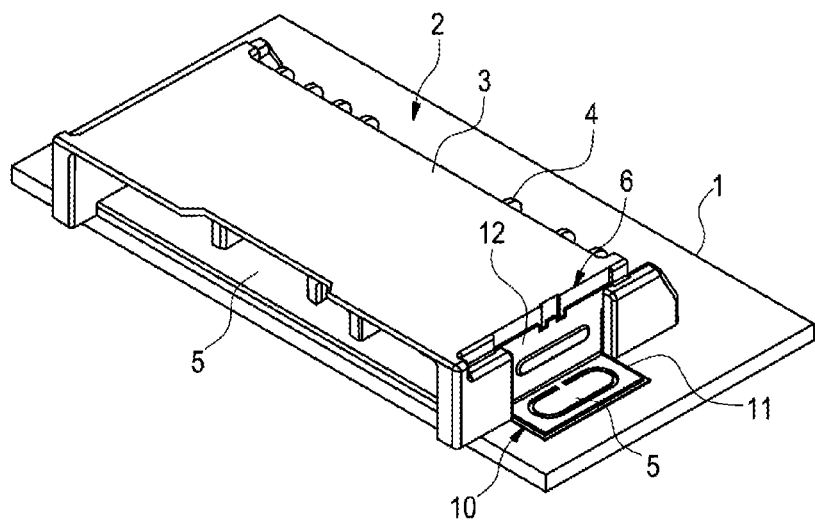
Figure 2:
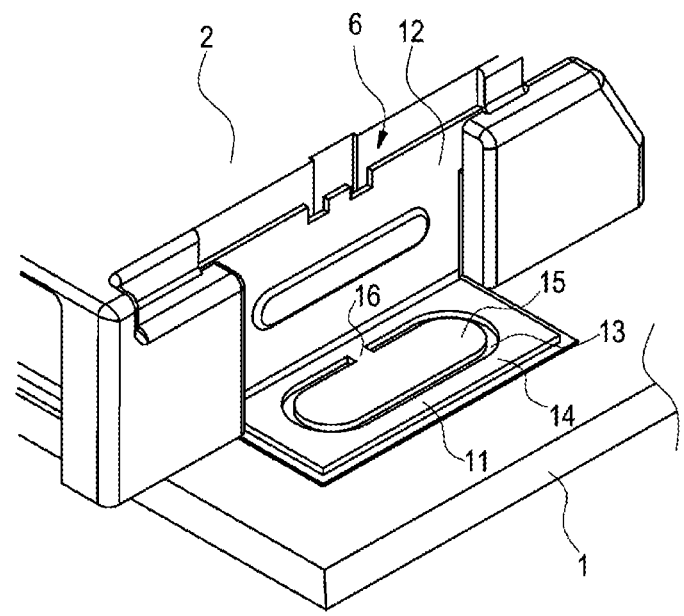

An embodiment of the invention is described below with reference to drawings. FIG. 1 is a structural view showing a fixing metal bracket according to the embodiment, FIG. 1(a) is a perspective view showing the same obliquely viewed from the upper side, and FIG. 1(b) is perspective view showing the same obliquely viewed from the lower side. FIG. 2 is a schematic view showing a state in which a board mount connector is fixed on a circuit board by using the fixing metal bracket, FIG. 2(a) is an entire perspective view showing the state and FIG. 2(b) is an enlarged perspective view showing a main part of the state.

As shown in FIGS. 1(a) and 1(b) and FIGS. 2(a) and 2(b), a fixing metal bracket 10 of the embodiment is to be attached to each of both side portions of a board mount connector 2 (a component to be mounted on a circuit board) to be mounted on a circuit board 1 and is a plate-like article formed to have an L-shaped cross section by being bent. The fixing metal bracket 10 includes a solder bonding plate section 11 which is to be solder-fixed on a surface of the circuit board 1 by using a cream solder, and a component fixing section 12 which is to be inserted into and fixed to a metal bracket attachment section 6 of each of both side portions of a connector housing 3 of the connector 2 (a component to be mounted on the circuit board).

The connector 2 is configured such that many terminals 4 are attached to a rear wall portion of the connector housing 3 having a fitting hole 5 of a counter connector at its front face. Front ends of the respective terminals 4 are exposed in an inner part of the fitting hole 5 of the connector housing 3. Rear leg portions of the respective terminals 4 extending toward the rear side of the connector housing 3 are connected to circuit conductors of the circuit board 1, and thereby the connector 2 is mounted on the circuit board 1.

In addition, since an attachment strength is not sufficient only by the above, a solder bonding face 11B of the solder bonding plate section 11 of the fixing metal bracket 10 attached to each of the both side portions of the connector housing 3 is solder-bonded on the circuit board 1 by using a cream solder, and thereby the connector 2 is fixed on the circuit board 1.

In this case, as shown in FIGS. 1(a) and 1(b), an ellipsoidal annular through-groove 13 is formed on the solder bonding plate section 11 of the fixing metal bracket 10 at a portion surrounding a central area thereof so as to pass therethrough in a plate thickness direction while partially leaving a connection part 16 in a circumferential direction. By forming the through-groove 13, an island-shaped portion 15 at the inside of the through-groove 13 is cut and separated from a peripheral portion 14 at the outside of the through-groove 13 while leaving the connection part 16.

In addition, a step 17 which is recessed from the solder bonding face 15B of the island-shaped portion 15, is formed on the connection part 16 at a solder bonding face 11B side. The step 17 is formed in such a manner that a lower face of the connection part 16 is hit so as to thin the connection part 16. Pure Sn plating is applied to the solder bonding face 15B of the island-shaped portion 15, and whisker resistance plating of Sn—Cu, Sn-A9 or the like is applied to a surface of a portion other than the above.

In a case where the connector 2 is mounted on the circuit board 1 by using the fixing metal brackets 10, a cream solder is applied to a portion where the solder bonding plate section 11 of each of the fixing metal brackets 10 is to be placed in advance, and then the solder bonding plate section 11 of each of the fixing metal brackets 10 is placed thereon. After that, the circuit board 1 is passed through a reflow chamber, and thereby the solder bonding plate sections 11 are bonded on lands of the circuit board 1. Since the pure Sn plating is applied to the solder bonding face 15B of the island-shaped portion 15 at the inside of the annular through-groove 13 at that time, the island-shaped portion 15 exhibits a good soldering property (a solder adhesion property).

In addition, since the whisker resistance plating of Sn—Cu, Sn—Ag or the like is applied to the peripheral portion 14 at the outside of the island-shaped portion 15, the island-shaped portion 15 exhibits a good whisker resistance property while the soldering property is not so good.

Figure 3:
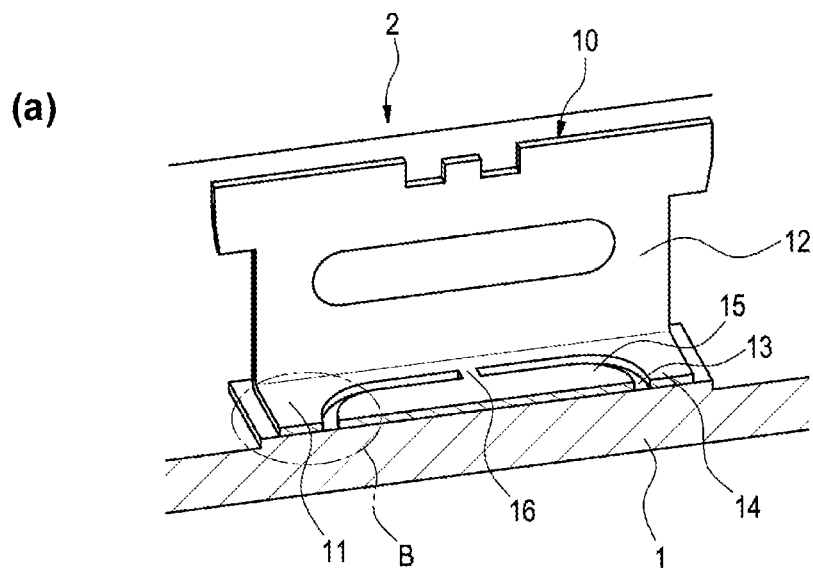
Figure 3:
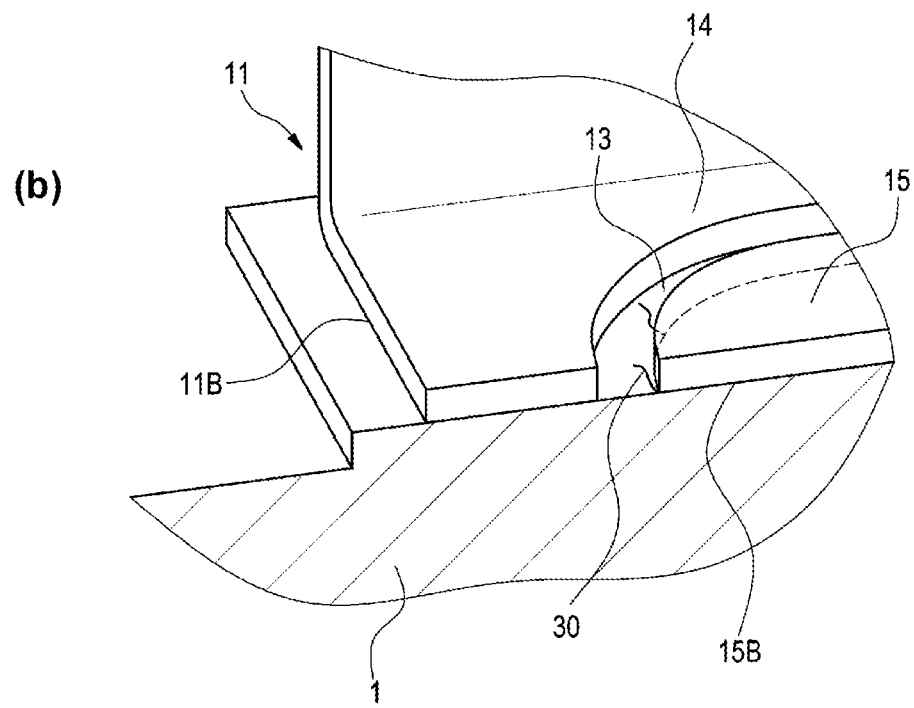

Therefore, as shown in FIGS. 3(a) and 3(b), while a whisker 30 is created at an edge of the island-shaped portion 15 where the pure Sn plating is applied, there is not any chance that growth of the whisker spreads to the peripheral portion 14 so that it is possible to prevent a component at the outside of the fixing metal bracket 10 from being influenced by the whisker 30.

In addition, since there is the step 17 on the solder bonding face of the connection part 16 which is partially left at the annular through-groove 13 in the circumferential direction thereof, it is possible to prevent spreading of heterogeneity plating by the step 17 and to suppress growing of the whisker 30, and thereby it is also possible to eliminate any chance that the peripheral portion 14 is influenced by the whisker 30 via the connection part 16.

Consequently, a short circuit between a peripheral component and the fixing metal bracket 10 caused by the whisker 30 can be prevented in advance. In addition, the fixing metal bracket 10 has a simple configuration in which the through-groove 13 is formed on the solder bonding plate section 11, the step 17 is provided on the connection part 16 and kinds of plating are differentiated by each area. Therefore, a particularly high processing precision is not required, the manufacturing is easy and increase of the cost can be suppressed.

Meanwhile, the invention is not limited to the above embodiment, but changes, modifications or the like can be made if necessary. Other than that, a material, a shape and a dimension of each component, the number of components, a placement position of each component and the like in the above described embodiment are arbitrary as long as the invention can be achieved so that they are not limited.

For example, while a case where the ellipsoidal annular through-groove 13 is formed, is described in the above described embodiment, the through-groove 13 can be formed in any shape as long as it is formed in an annular shape.

In addition, while a case where the single island-shaped portion 15 is demarcated by the single annular through-groove 13, is described in the above described embodiment, it is possible that a plurality of annular through-grooves are formed to demarcate a plurality of island-shaped portions.

Further, while it is preferable that only one connection part 16 is provided at one annular through-groove 13, a plurality of connection parts 16 can be provided.

While the invention is described in detail by referring to a specific embodiment, it is understood by those of ordinary skill in the art that various modifications and changes can be made without departing from the sprit and scope of the invention.

This application is based on Japanese Patent Application (JP-2010-167814) filed on Jul. 27, 2010, the contents of which are incorporated herein by reference.

INDUSTRIAL APPLICABILITY

In accordance with the invention, it is possible to exhibit a good soldering property and a high whisker resistance property without requiring a particularly high processing precision.

DESCRIPTION OF REFERENCE NUMERALS AND SIGNS

1 circuit board
2 connector (component to be mounted on circuit board)
10 fixing metal bracket
11 solder bonding plate section
11B solder bonding face
12 component fixing section
13 through-groove
14 peripheral portion
15 island-shaped portion
15B solder bonding face
16 connection part
17 step

The invention claimed is:

1. A fixing metal bracket for a component mounted on a circuit board, comprising:

a solder bonding plate section configured to be solder-fixed on a surface of a circuit board with a cream solder; and a component fixing section configured to be fixed to a component to be mounted on the circuit board, wherein an annular through-groove is formed on the solder bonding plate section at a position surrounding a central area of the solder bonding plate section so as to pass therethrough in a plate thickness direction while a connection part is partially remained in a circumferential direction, and thereby an island-shaped portion at the inside of the through-groove is separated from a peripheral portion at the outside of the through-groove while the connection part is remained;

wherein a step which is recessed from a solder bonding face of the island-shaped portion is formed on a solder bonding face of the connection part; and wherein pure Sn plating is applied to the solder bonding face of the island-shaped portion, and whisker resistance plating is applied to a surface of a portion other than the island-shaped portion.

* * * * *